US010539457B2

(12) United States Patent
Dieguez Barrientos et al.

(10) Patent No.: US 10,539,457 B2
(45) Date of Patent: Jan. 21, 2020

(54) SIGNAL PROCESSING METHOD FOR HISTOGRAM GENERATION, AND CORRESPONDING DEVICE AND USE COMPRISING A CURRENT INJECTION MODULE CONNECTED TO PLURAL CAPACITORS ASSIGNED TO A PLURALITY OF BINS (71) Applicant: UNIVERSITAT DE BARCELONA, Barcelona (ES)

(72) Inventors: Angel Dieguez Barrientos, Collbató (ES); Oscar Alonso Casanovas, Sant Sadurní d'Anoia (ES); Joan Canals Gil, Sant Sadurní d'Anoia (ES); Eva Vilella Figueras, Liverpool Merseyside (GB)

(73) Assignee: UNIVERSITAT DE BARCELONA, Barcelona (ES)

( * ) Notice: Subject to any disclaimer, the term of this patent is extended or adjusted under 35 U.S.C. 154(b) by 150 days.

(21) Appl. No.: 15/768,084

(22) PCT Filed: Oct. 20, 2016

(86) PCT No.: PCT/EP2016/075211
§ 371 (c)(1),
(2) Date: Apr. 13, 2018

(87) PCT Pub. No.: WO2017/068035
PCT Pub. Date: Apr. 27, 2017

(65) Prior Publication Data
US 2018/0313688 A1 Nov. 1, 2018

(30) Foreign Application Priority Data

Oct. 22, 2015 (EP) .................................. 15382520

(51) Int. Cl.
*G01J 1/46* (2006.01)
*G01J 1/02* (2006.01)
(Continued)

(52) U.S. Cl.
CPC ............... *G01J 1/0238* (2013.01); *G01J 1/46* (2013.01); *H03K 5/1534* (2013.01); *H03K 5/19* (2013.01);
(Continued)

(58) Field of Classification Search
CPC ..... A61B 5/4836; A61B 5/0452; A61B 5/053; H03K 19/00315; H03K 5/1534;
(Continued)

(56) References Cited

U.S. PATENT DOCUMENTS 8,395,127 B1    3/2013  Frach et al.
9,354,332 B2 *  5/2016  Zwaans ................. G01T 1/2985

FOREIGN PATENT DOCUMENTS

GB    2447264    9/2008
GB    2479053    9/2011

OTHER PUBLICATIONS

Written Opinion of the International Searching Authority for International Application No. PCT/EP2016/075211, dated Feb. 21, 2017.
(Continued)

Primary Examiner — Que Tan Le
(74) Attorney, Agent, or Firm — Staas & Halsey LLP (57) ABSTRACT Signal processing method for histogram generation, and corresponding device and use. The method generates the histogram from a plurality of event detectors that generate event signals as a response to external events, and are connected to a current injection module which is connected to a plurality of capacitors, wherein each histogram bin is univocally assigned to a capacitor. The method includes: during an event time interval corresponding to a bin, the event detectors generate event signals as a response to external events; the current injection module detects said event signals and, for each event signal, generates a corresponding current signal, which is injected in a capacitor assigned to said bin, and stored therein; repeating steps for each successive bin of said histogram; and reading the charge accumulated in each of said capacitors.

20 Claims, 5 Drawing Sheets (51) Int. Cl.
*H03K 5/19* (2006.01)
*H03K 5/1534* (2006.01)
*G01J 1/44* (2006.01)

(52) U.S. Cl.
CPC . *G01J 2001/442* (2013.01); *G01J 2001/4466* (2013.01)

(58) Field of Classification Search
CPC .. H03K 5/19; G01J 1/0238; G01J 1/46; G01J 2001/4466
USPC .......................................... 250/214 R, 214.1
See application file for complete search history.

(56) References Cited

OTHER PUBLICATIONS

International Search Report for International Application No. PCT/EP2016/075211, dated Feb. 21, 2017.

* cited by examiner

SIGNAL PROCESSING METHOD FOR HISTOGRAM GENERATION, AND CORRESPONDING DEVICE AND USE COMPRISING A CURRENT INJECTION MODULE CONNECTED TO PLURAL CAPACITORS ASSIGNED TO A PLURALITY OF BINS

CROSS-REFERENCE TO RELATED APPLICATIONS

This application claims the benefit under 35 U.S.C. Section 371, of PCT International Application No. PCT/EP2016/075211, filed Oct. 20, 2016, which claimed priority to European Patent Application No. 15382520.3, filed Oct. 22, 2015, the contents of which are incorporated herein by reference.

FIELD OF THE INVENTION

The invention relates to a signal processing method for histogram generation from a plurality of event detectors, wherein each of said event detectors generates an event signal as a response to an external event. The invention also relates to a corresponding device and use.

PRIOR ART

A histogram is a representation of the distribution of numerical data. To generate a histogram, the first step is to divide the entire range of values into a series of small intervals known as bins (this sometimes is referred as to "bin" the range of values), and then count how many values fall into each interval.

Histogram generation is used in several applications, among them, but not limited to, measures of fluorescence decay time of biological samples such the ones used for diagnosis and monitoring of a large number of diseases, including cancer and dementia. This kind of measures typically needs an extreme sensitivity and circuits able to operate at very small time scale, even at nanoseconds or picoseconds. Other applications include noise characterization versus time, wireless network modelling, internet traffic modelling, etc. all of them share the problem of dealing with huge amounts of data in brief time scales.

In the example of fluorescence decay histograms, up to date the chosen event detectors have been PhotoMultiplier Tubes (PMTs), Charge Coupled Devices (CCDs) and recently Single-Photon Avalanche Diodes (SPADs), being the latter an increasingly common solution since they are less bulky and expensive. Other applications relay on other types of event detectors.

For the histogram generation, a single one or an array of event detectors in the form of the detectors named earlier are connected to a readout circuit in charge of generating the desired histogram.

In time-gated solutions the detectors are periodically enabled and disabled to acquire single events in consecutive time bins. The problem with this kind of approaches is that the obtainable resolution low, and not suitable for time-critical applications such are measures of fluorescence decay times.

Other methods rely on accounting the arrival time of each single event. For example, when using SPADs, is common that the avalanche currents originated by the impact of a photon in the photodiode are detected with a simple circuit such is a comparator, and then accounted using different methods that can be on-chip or off-chip. In this context on-chip refers to solutions integrated with the sensor circuit while off-chip requires a communication interface with external components. Generally speaking, the more data to transmit at high frequency rates the more power consumption.

In several known solutions, the accounting the arrival time of each event it's done, for example, with an off-chip Field Programmable Gate Array (FPGA) or with on-chip Time to Digital Converters (TDC), and then performing the aggregation for each bin of the histogram, that is, performing the sum of the number of events that have happened during the time window of each of the bins. These solutions have fine-grain resolution, but they also tend to require high power consumption due to the large number of commutations at high frequency rates.

Besides, using lots of TDCs, in special when there's not only a single event detector but an array of them, leads to a bulkier devices, and can also have an impact on the cost.

So it is needed a solution able to generate high resolution histograms and at the same time maintain a low power consumption and a contained production cost.

SUMMARY OF THE INVENTION

The invention is aimed to provide a signal processing method for histogram generation able to generate a histogram on-chip using a low power-consumption circuit.

This purpose is achieved by a signal processing method for histogram generation of the type indicated at the beginning, characterized in that the event detectors are connected to a current injection module which is connected to a plurality of capacitors, wherein the histogram to be generated comprises a plurality of bins and each of the bins is univocally assigned to a capacitor among the plurality of capacitors, the method comprising the steps of:

[a] during an event time interval corresponding to a bin, the plurality of event detectors generates a plurality of event signals as a response to a plurality of external events,

[b] the current injection module detects said event signals,

[c] for each one of the event signals, the current injection module generates a corresponding current signal, and said current signal is injected in a capacitor assigned to the bin, and stored therein,

[d] repeating steps [a] to [c] for each successive bin of the histogram, and wherein the method also comprises reading the charge accumulated in each of the capacitors for the bin assigned to said capacitor.

This way, for each external event detected by the plurality of event detectors inside a particular bin of the histogram, a corresponding current signal is generated by the current injection module, and injected in the capacitor associated to that bin. This way, the accumulated charge in the capacitor is directly linked to the number of external events that have happened during the time of that bin of the histogram. For example, if the current injection module generates a current j for each event, and during the interval of a bin a total of p events occur, the total charge generated, and then accumulated in the capacitor would be p·j. Therefore, during the process, the charge stored in the capacitors is directly linked to the final histogram. Besides, the readouts of each capacitor are accumulated values and, as such, the amount of data is reduced, so a high frame rate (small histogram windows) can be achieved. Finally the method doesn't need highly complex digital gates commuting at high frequencies and, therefore, the power consumption is low. In the context of this document, the current signal to be injected can be positive (charging the capacitor) or negative (discharging the capacitor), for the sake of clarity and simplicity, most of the examples only relate to the positive version, but they are both possible. Preferably, said histogram is a pure time histogram, wherein each bin of the histogram contains the accumulated number of external events during a time interval.

The invention further includes a number of preferred features that are object of the dependent claims and the utility of which will be highlighted hereinafter in the detailed description of an embodiment of the invention.

In a preferred embodiment, the current injection module comprises one dedicated branch for each pair of event detector and capacitor. Therefore, there is one dedicated branch of circuit between each event detector and each capacitor, and it is possible to independently control the current injection coming from each of the event detectors into the dedicated capacitors corresponding to each bin.

In a preferred embodiment, each event detector is univocally connected to a dedicated current injection module, and each current injection module is univocally connected to a plurality of capacitors. Therefore, each event detector has its own dedicated circuit with a current injection module and a group of capacitors that are different from the current injection module and capacitors of the others event detectors. Thus, the actions performed by one current injection module and one plurality of capacitors refer only to one event detector. This way, each event detector can generate a complete time histogram since each event detector has its own group of capacitors, one for each bin of the histogram to be generated. Thus, each event detector has its own dedicated circuit and can be controlled independently. This is particularly advantageous in order to detect faulty event detectors and ignoring their measures selectively, for example, disabling their particular circuit. Depending on the application, the final histogram can be a combination of the individual histograms of the active event detectors.

Preferably, each current injection module has a dedicated branch for each capacitor of said plurality of capacitors. Therefore, there is one dedicated branch of circuit between the event detector connected to the current injection module and each of the capacitors connected to it, and it is possible to independently control the current injection coming from the event detector into the dedicated capacitors corresponding to each bin.

In a preferred embodiment, the plurality of event detectors comprises Single-Photon Avalanche Diodes (SPAD) or arrays thereof. SPADs are solid state photodetectors able to detect signals with an intensity as low as a single photon, and generate an avalanche current with a jitter of a few tens of picoseconds.

In a preferred embodiment, the duration of each of said event time intervals is less than 500 ps, preferably less than 200 ps, more preferably within the range of 80 ps to 120 ps. These small windows are the intervals used for time-critical applications such are measuring fluorescence decay times for biological tissue samples.

In a preferred embodiment, for each of said bins, the capacitor which is assigned to said bin stores said current signals during a pre-defined injection time interval associated to said capacitor and to said bin.

Preferably, the duration of each of the injection time intervals is within the range of 50 ps to 200 ns, preferably between 1 ns and 50 ns. For time critical applications these ranges are an advantageous trade-off between the time required to obtain the measure and the circuit working frequency, also taking into account the time required by the capacitor to accumulate the charge.

In a preferred embodiment, the injection time interval associated to one bin among the plurality of bins is different in terms of start time and/or duration from the event time interval corresponding to the same bin. Thus, both intervals are not coupled and one can be even bigger than the other. This is particularly advantageous when the time interval for the bin needs to be very small (ie. when measuring fluorescence decay time), allowing to use a wider injection time window that will also start later than the bin interval time.

Preferably, the injection time intervals associated to the plurality of capacitors are overlapped in time. Therefore, a number of injections can be done simultaneously, which is an advantage if the time for the whole measure needs to be as small as possible, in special if the injection time intervals are longer than the event time intervals. In the last case, as a non-limitative example, the injection time interval for a bin can be done after the event time interval of that bin, and there's no need to wait for the finalization of the previous injection timer interval.

In another preferred embodiment, the injection time intervals associated to the plurality of capacitors are sequential and not overlapped in time. Therefore, it's possible to use the same circuit components which results in smaller and cheaper implementations, potentially also with smaller peaks of power consumption.

In a preferred embodiment, the reading of the charge accumulated in each of the capacitors is done after the end of the injection time interval associated to the capacitor. This does not imply that the reading is done just after the end, but also in a later moment in time. The skilled person will not have problems determining the maximum reading delay taking into account the discharge time of the capacitor. This way it's possible to grant that all the current signals corresponding to event signals are already stored in the capacitor, and thus, the accumulated charge is related to the number external events detected during the event time interval corresponding to that capacitor.

In a preferred embodiment, the steps [a] to [d] are repeated N times as to for N consecutive histograms, and the reading of the charge accumulated in each of the capacitors is done only after N-th step [d]. As a non-limitative example, when measuring fluorescence histograms, it is typical to illuminate the sample with a well-determined light (ie. a laser pulse or series of pulses), after each illumination, the sample responds with a fluorescence pattern, emitting photons that are detected by the event detectors. For each detected photon, the current injection module generates a corresponding current signal which is injected in the capacitor. This process of illumination and injection is repeated a number of times, for example 1000 times, and the accumulated charge is only read after the last injection time interval. Therefore, if the capacitor's discharge is negligible, the final accumulated charge in a capacitor assigned to a bin of the histogram is directly related to the number of events multiplied by the number of iterations, this is, the mean value of events for that bin multiplied by a constant value. The skilled person will understand that mean values are adequate to minimize the impact of noise in the measures. This way, the proposed method is advantageously suited to obtain mean histograms profiles with a single measure per capacitor only at the end of the cycle, and therefore, dividing by N the volume of data to be transmitted compared to the case of a measure per iteration. This is particularly advantageous to reduce the power consumption due to commutations as well as the data transfer volume required to obtain the final histogram.

Another purpose of the invention is a signal processing device for histogram generation from a plurality of event detectors, wherein said histogram is of the kind that comprises a plurality of bins, wherein each of the event detectors generates an event signal as a response to an external event, the device being characterised in that it comprises a circuit, said circuit comprising a current injection module, a plurality of capacitors connected to the current injection module, each of the capacitors intended to be assigned to a bin, and a reading circuit for reading a charge accumulated in each of said capacitors;

and in that the circuit is configured to carry out the following steps for generating the histogram:

[a] during an event time interval corresponding to a bin, the plurality of event detectors generates a plurality of said event signals as a response to a plurality of external events,

[b] the current injection module detects the event signals,

[c] for each one of said event signals, the current injection module generates a corresponding current signal, and said current signal is injected in a capacitor assigned to the bin, and stored therein,

[d] repeating steps [a] to [c] for each successive bin of the histogram, and reading the charge accumulated in each of the capacitors for the bin assigned to said capacitor. As discussed above, this configuration allows high frame rates while maintaining a low profile of power consumption and fabrication costs.

In a preferred embodiment, the current injection module comprises one dedicated branch for each pair of event detector and capacitor. Allowing time windows decoupling and independence for each particular capacitor.

In a preferred embodiment, each event detector is univocally connected to a dedicated current injection module, and each current injection module is univocally connected to a plurality of capacitors.

Preferably, each current injection module has a dedicated branch for each capacitor of said plurality of capacitors.

In a preferred embodiment, said plurality of event detectors comprises Single-Photon Avalanche Diodes or arrays thereof. Therefore single-photon resolution can be achieved, which is necessary for applications such are, but not limited to, fluorescence decay time of biological samples.

In a preferred embodiment, said circuit is a CMOS circuit, particularly when using SPADs as event detectors, as it allows that all the components can be monolithically integrated using CMOS processes, which leads to a very compact and efficient design.

In a preferred embodiment, said reading circuit comprises an amplifier and a digital converter, preferably selected from the group consisting in an Analog to Digital Converter, a Time to Digital Converter or a Time over Threshold circuit.

Another purpose of the invention is the use of the method described above to generate a histogram of fluorescence lifetime from a biological sample. This method is particularly well suited for that kind of application since it allows high frame rates (small histogram windows), has a contained power consumption and the overall production cost is low compared to the state of the art solutions.

Likewise, the invention also includes other features of detail illustrated in the detailed description of an embodiment of the invention and in the accompanying figures.

BRIEF DESCRIPTION OF THE DRAWINGS

Further advantages and features of the invention will become apparent from the following description, in which, without any limiting character, preferred embodiments of the invention are disclosed, with reference to the accompanying drawings in which.

DETAILED DESCRIPTION OF EMBODIMENTS OF THE INVENTION

Figure 1:
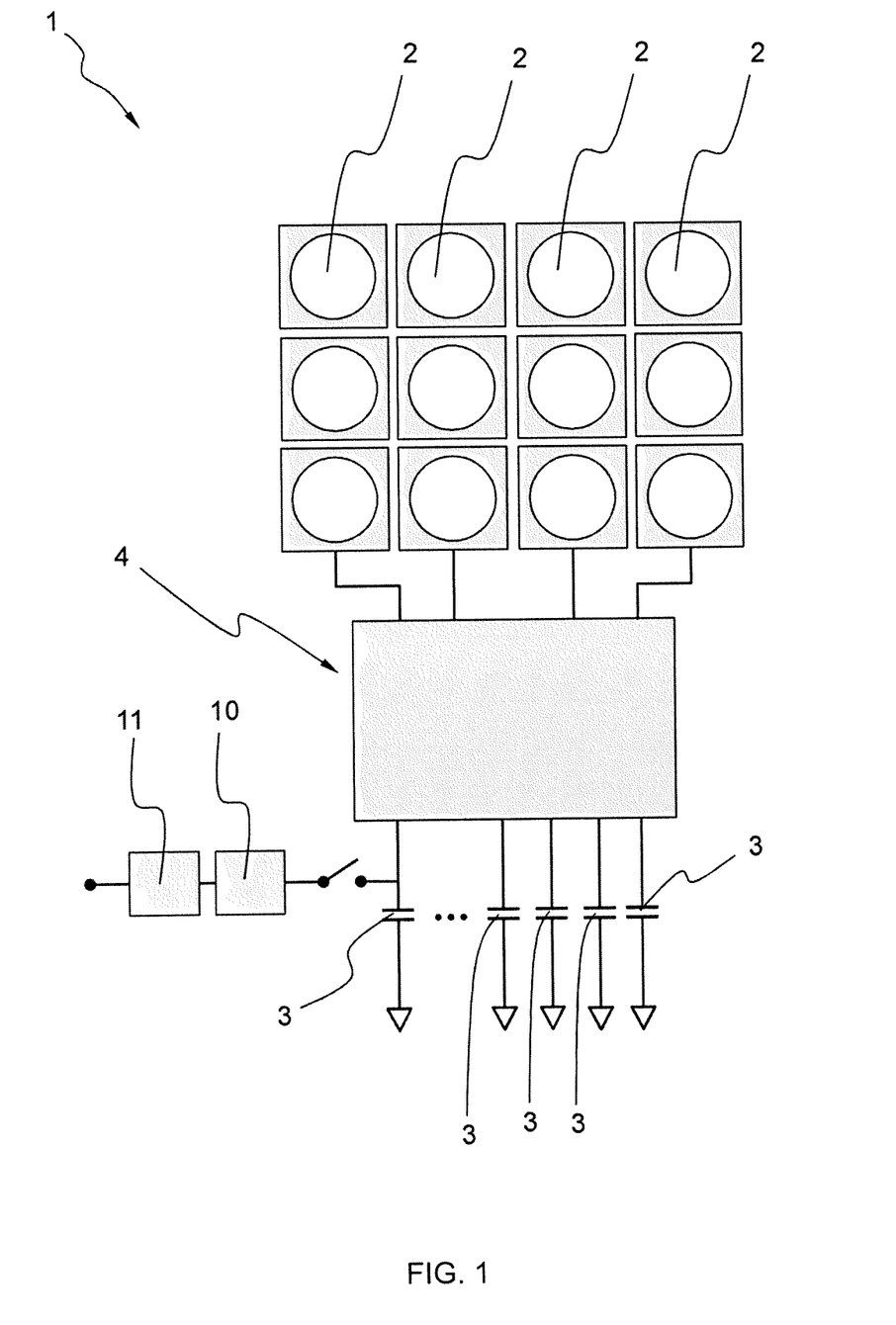
FIG. 1 is a simplified layout of the signal processing device for histogram generation.
Figure 2:
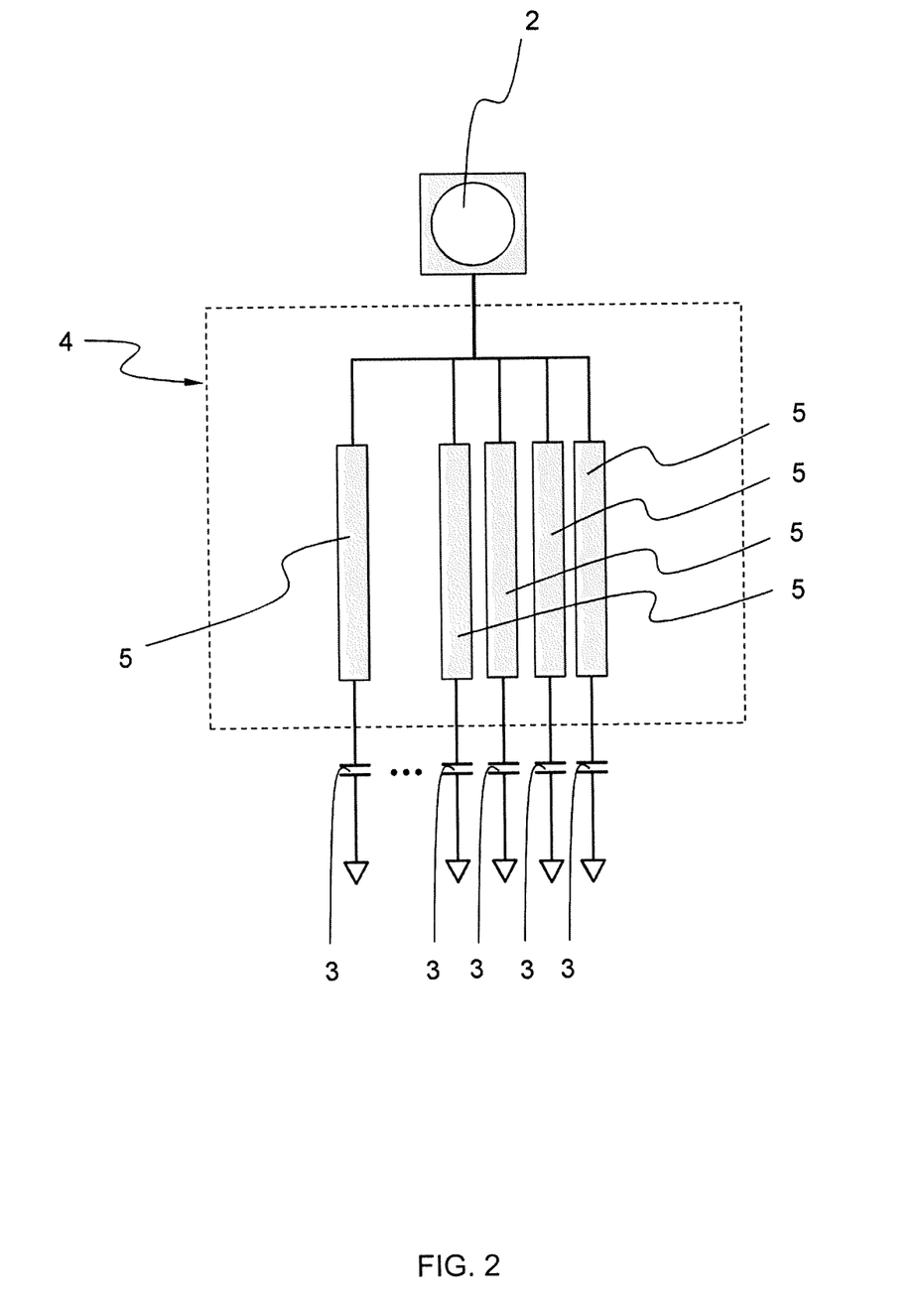
FIG. 2 is a simplified detail view of the current injection module for one particular exemplary embodiment where each pair of event detector and capacitor has a dedicated branch circuit.

In one exemplary embodiment shown in FIG. 1 and FIG. 2, the signal processing device 1 for histogram generation is aimed to measure fluorescence decay times of biological samples. This embodiment uses an array of Single-Photon Avalanche Diodes (SPADs) as event detectors 2, in particular it uses a matrix of N×M identic SPADs.

In the embodiment, each SPADs generates an avalanche current as a response of the impact of a photon. Therefore, in this exemplary embodiment, the external event corresponds to the impact of a photon, and the event signal corresponds to said avalanche current.

In this exemplary embodiment, the event time interval corresponding to each bin of the histogram is a time window of around 100 ps. For each bin to be generated there is a univocally identified capacitor 3 that will store a current that will be dependant of the number of external events (photon impacts) that had happened during the event time interval of that bin. Therefore, the circuit contains as many capacitors 3 as the number of bins desired for the histogram, in the case of the example 10. Between the SPADs and the capacitors 3, there is a current injection module 4 that, for this example, has a CMOS architecture and comprises one dedicated branch 5 of circuit per SPAD and per capacitor 3. The task of each of these circuits is to detect the avalanche currents and to generate a corresponding current signal that will be injected in the capacitor 3 associated to each bin. In the example, these currents signals are pulses of known intensity and time, in particular the example uses square pulses.

In the example, each capacitor 3 has an injection time interval of the same length (around 10 ns), but starting at different times that can overlap, and that are decoupled from the corresponding event time interval. This means that, even if the events are detected during the event time interval, the corresponding current signals are injected in the capacitor 3 in a moment of time that is not necessarily the sum of a delay after the event timestamp, but that could, for instance, take into account the time necessary for the capacitor 3 to reach the charge. This has two particular advantages: the first one is that the injection time interval can be a much bigger time window than the event time interval, which leads to simpler circuits. The second one is that the expert can design the timings and event detection strategies in accordance with the requirements of the circuit: for example, if an avalanche current starts at the end of a first bin continues during the beginning of the next bin, the current injection module 4 can be designed to create an current signal during the injection time interval corresponding to said first bin, and none during the next bin.

Even if it's not shown in the FIG. 1 for the sake of clarity, the exemplary embodiment of the device 1 comprises a reset circuit for each capacitor 3, which in this case is a switch connected in parallel to said capacitor 3 and to ground, in such a way than when the switch allows the pass of current, the capacitor 3 discharges its accumulated charge to ground. In the exemplary embodiment this discharge is done as a previous step to the rest of the process that will be described below. Regarding this point, the skilled person will understand that the invention can alternatively use a capacitor 3 discharge instead of charge, this option can be accomplished if the reset circuit loads the capacitor 3 with an initial charge, and if the current signals are pulses of negative potential.

Also for the sake of clarity, FIG. 1 and FIG. 2 neither show the required control circuit used for control and synchronization of the elements of the device 1. In particular, said control circuit is in charge of opening and closing the different switches at appropriate times. The sync signals can be created using the natural delay of logic gates or alternatively with counters.

In the exemplary embodiment shown in FIG. 1 and FIG. 2, the readout circuit to read the accumulated charge in the capacitors 3 comprises an amplifier 10 that amplifies the measured charge in the capacitor 3 and later an Analog-to-Digital Converter (ADC) 11. The exit of the ADC is a digital output signal that contains the value of the measure for the histogram bin assigned to the capacitor 3, multiplied by a factor of scale, which is a function of, among other variables, the intensity of the current signal, and the amplification factor in the amplifier 10.

Figure 3:
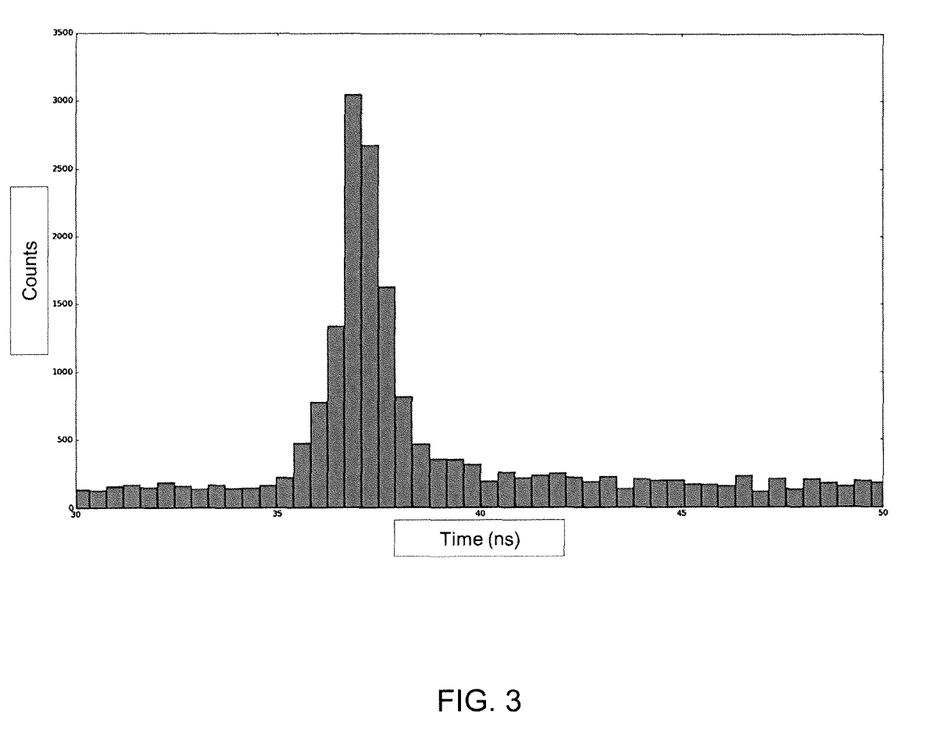
FIG. 3 is an exemplary of a histogram of an application related to fluorescence.

The process of histogram generation in the current example is described herein. Starting with all the capacitors 3 discharged and all its corresponding injection circuits switched off, the measure is as follows:

[a] the sample is illuminated with a train of very short light pulses using a LASER,

[b] during the event time interval corresponding to a bin, the SPADs respond with an avalanche current to each photon coming from the sample that impact in the SPAD,

[c] the current injection module 4 detects said event signals (avalanche currents),

[d] for each one of said event signals, the current injection module 4 generates a corresponding current signal, which is injected in a capacitor 3 assigned to the bin, and stored therein, during an injection time interval associated to the capacitor 3 and the bin,

[e] repeating steps [b] to [d] for each successive bin of said histogram,

In the exemplary embodiment, the steps [a] to [e] are repeated several times, in an example even tenths of thousands of times. After these number of iterations, each capacitor 3 contains the accumulated charge for each bin of each iteration, and the effect of noise or unwanted interferences is reduced due to the usage of these accumulated values. Only then the charge of each capacitor 3 is measured in order to obtain the desired histogram. The time lags between iterations, the injection time windows and the capacitors 3, among other components, have to be selected in a way that the leak discharges of the capacitors 3 are minimal and have a negligible effect in the final measure An exemplary histogram that could be generated using the invention is shown on FIG. 3.

Figure 4:
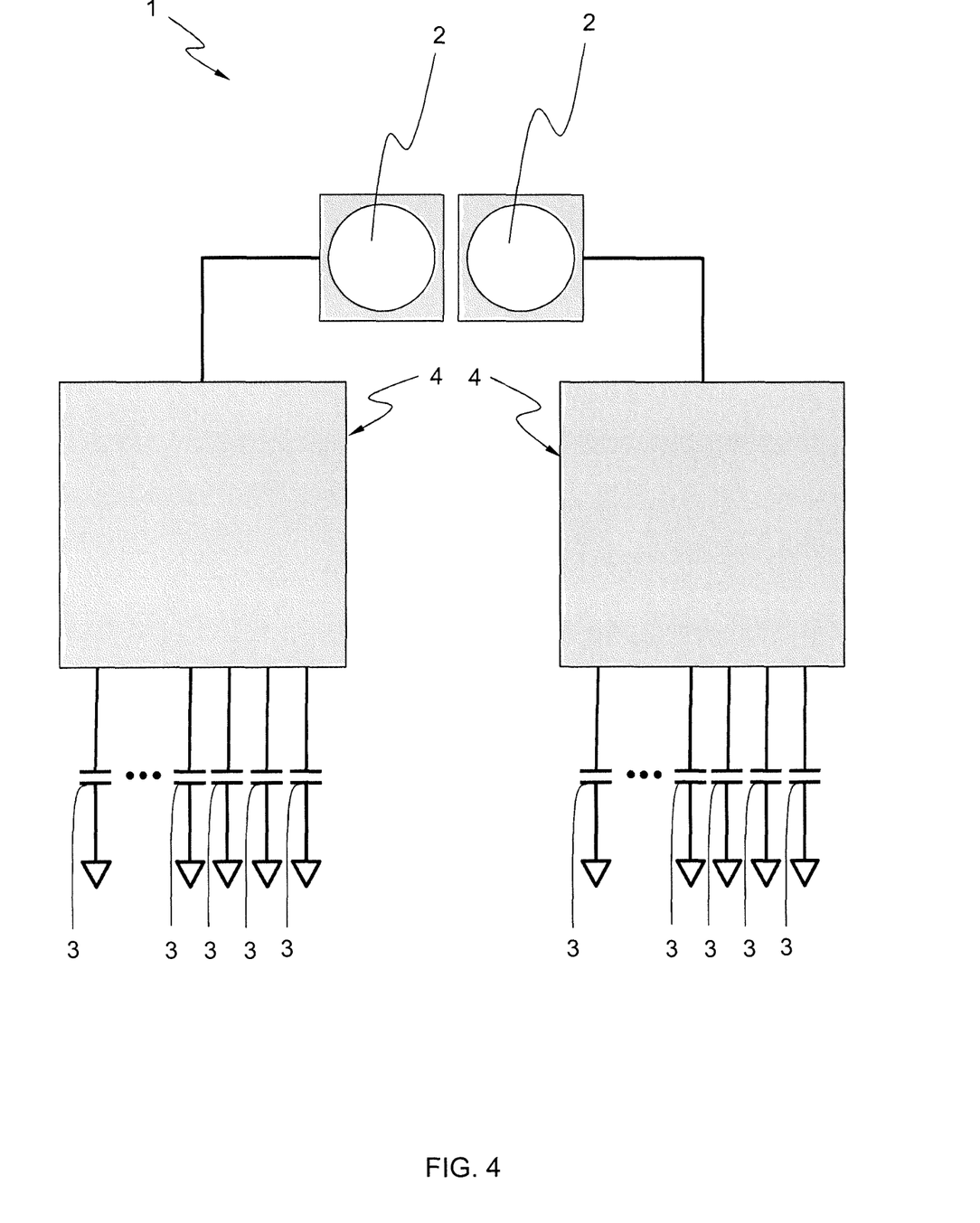
FIG. 4 is a simplified layout of one particular exemplary embodiment where each event detector has a dedicated current injection module and capacitors. For the sake of clarity, the figure only shows two event detectors.

FIG. 4 shows another exemplary embodiment of the invention. In the case of the figure, each event detector 2, for example a SPAD 2, is connected to its particular current injection module 4, in a way that each current injection module 4 is only connected and used for a particular event detector 2, that is, it only detects the event signals (in this case avalanche currents) of that particular SPAD 2 and it only generates current signals for that particular SPAD 2. Likewise, each SPAD 2 has its own set of capacitors 3 that are not shared among the plurality of SPADs 2, and that only receive the current signals from said particular current injection module 4 connected to said SPAD 2. Therefore, each SPAD 2 has its own circuit with its own current injection module 4 and its own set of capacitors 3. In this exemplary embodiment each SPAD 2 among the plurality of SPADs 2 generates its own time histogram using its own capacitors 3, one capacitor 3 for each bin of the histogram. In consequence, every capacitor 3 corresponds to one particular SPAD 2 and is assigned to one of the bins of the histogram that can be generated by that particular SPAD 2.

Since in real life applications some SPADs 2 can be defective and generate avalanche currents even without the presence of photons (noise signals), this exemplary embodiment allows to detect which of this SPADs 2 are defective and, if any, deactivate its measures selectively. Therefore, this embodiment can be used to obtain a better SNR for the set of SPADs 2 of the device 1. In an exemplary embodiment, the final histogram is generated as a linear combination of the individual histograms generated by each SPAD 2. That is, every bin of the final histogram is a linear combination of the corresponding bin of each individual histogram of each SPAD 2, for example, the mean value for that bin among the different SPADs 2.

Figure 5:
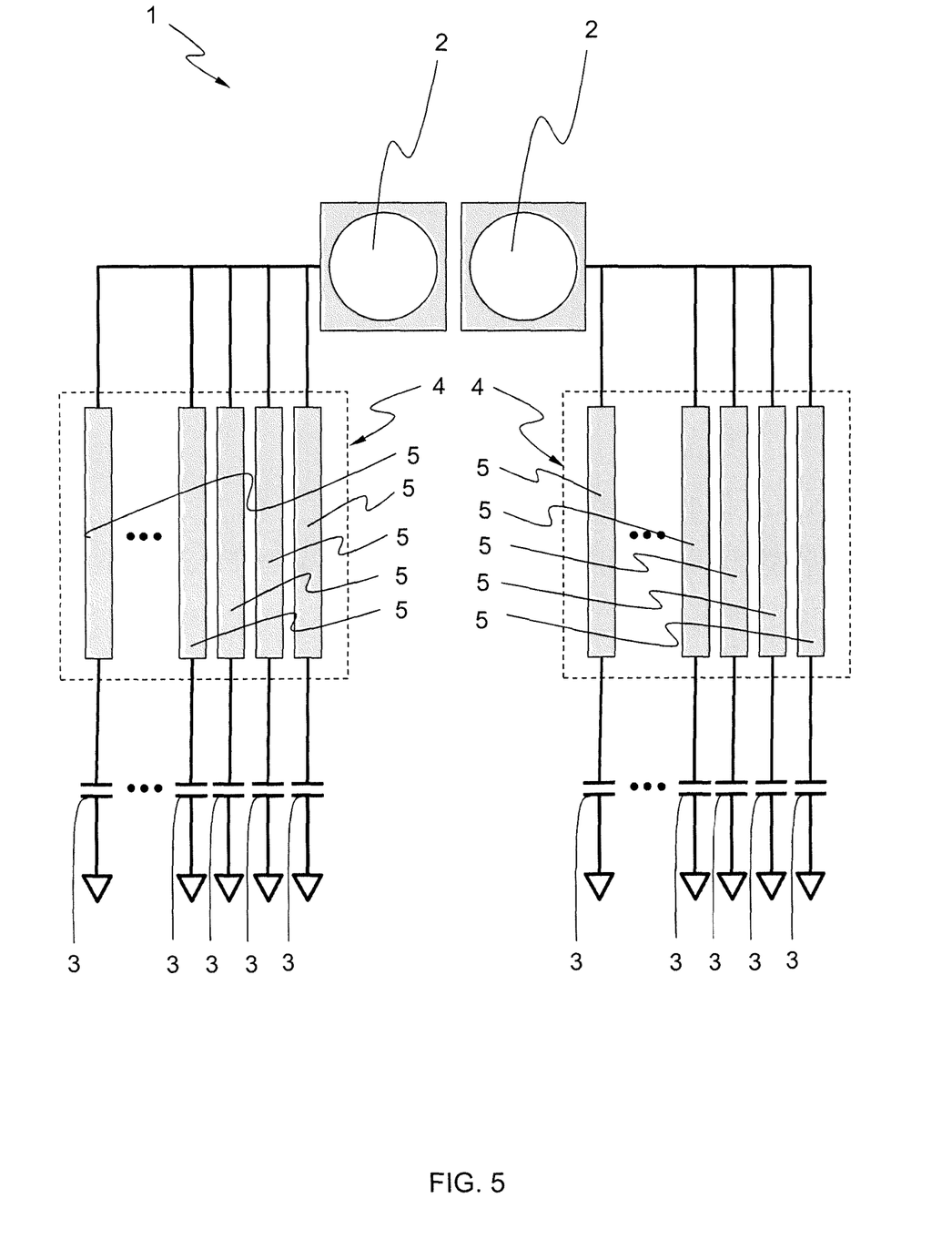
FIG. 5 is a simplified layout of a preferred embodiment for FIG. 4 wherein the current injection modules have one dedicated branch for each capacitor. For the sake of clarity, the figure only shows two event detectors.

FIG. 5 is a particular case of the exemplary embodiment discussed above, where each current injection module 4 has a dedicated branch 5 for each capacitor 3. Thus minimizing the use of switches and using independent branches 5 to generate the current signals.

The invention claimed is:

1. A signal processing method for histogram generation from a plurality of event detectors, wherein each of said event detectors generates an event signal as a response to an external event, wherein said event detectors are connected to a current injection module which is connected to a plurality of capacitors, wherein the histogram to be generated includes a plurality of bins and each of said bins is univocally assigned to a capacitor among said plurality of capacitors, the method comprising the steps of:

[a] during an event time interval corresponding to a bin, said plurality of event detectors generates a plurality of said event signals as a response to a plurality of external events;

[b] said current injection module detects said event signals;

[c] for each one of said event signals, said current injection module generates a corresponding current signal, and said current signal is injected in a capacitor assigned to said bin, and stored therein during a predefined injection time interval associated to said capacitor and to said bin which is different in terms of start time and/or duration from said event time interval corresponding to the same bin;

[d] repeating steps [a] to [c] for each successive bin of said histogram; and reading the charge accumulated in each of said capacitors for the bin assigned to said capacitor.

2. The method according to claim 1, wherein said histogram is a pure time histogram, wherein each bin of the histogram contains the accumulated number of external events during a time interval.

3. The method according to claim 1, wherein said current injection module comprises one dedicated branch for each pair of event detector and capacitor.

4. The method according to claim 1, wherein each event detector is univocally connected to a dedicated current injection module, and each current injection module is univocally connected to a plurality of capacitors.

5. The method according to claim 4, wherein each current injection module has a dedicated branch for each capacitor of said plurality of capacitors.

6. The method according to claim 1, wherein said plurality of event detectors comprises Single-Photon Avalanche Diodes or arrays thereof.

7. The method according to claim 1, wherein the duration of each of said event time intervals is less than 500 ps.

8. The method according to claim 1, wherein said injection time intervals associated with said plurality of capacitors overlap in time.

9. The method according to claim 1, wherein said reading of the charge accumulated in each of said capacitors is done after the end of said injection time interval associated to said capacitor.

10. The method according to claim 1, wherein said steps [a] to [d] are repeated N times as to for N consecutive histograms, and said reading of the charge accumulated in each of said capacitors is done only after N-th step [d].

11. A signal processing device for histogram generation from a plurality of event detectors, wherein said histogram is of the kind that includes a plurality of bins, wherein each of said event detectors generates an event signal as a response to an external event, comprising:

a circuit including a current injection module, a plurality of capacitors connected to said current injection module, each of said capacitors intended to be assigned to a bin, and a reading circuit for reading a charge accumulated in each of said capacitors;

wherein said circuit is configured to carry out the following steps for generating said histogram:

[a] during an event time interval corresponding to a bin, said plurality of event detectors generates a plurality of said event signals as a response to a plurality of external events,

[b] said current injection module detects said event signals,

[c] for each one of said event signals, said current injection module generates a corresponding current signal, and said current signal is injected in a capacitor assigned to said bin, and stored therein during a predefined injection time interval associated to said capacitor and to said bin which is different in terms of start time and/or duration from said event time interval corresponding to the same bin,

[d] repeating steps [a] to [c] for each successive bin of said histogram, and reading the charge accumulated in each of said capacitors for the bin assigned to said capacitor.

12. The signal processing device according to claim 11, wherein said histogram is a pure time histogram, and wherein each bin of the histogram contains the accumulated number of external events during a time interval.

13. The signal processing device according to claim 11, wherein said current injection module comprises one dedicated branch for each pair of event detector and capacitor.

14. The signal processing device according to claim 11, wherein each event detector is univocally connected to a dedicated current injection module, and each current injection module is univocally connected to a plurality of capacitors.

15. The signal processing device according to claim 14, wherein each current injection module has a dedicated branch for each capacitor of said plurality of capacitors.

16. The signal processing device according to claim 11, wherein said plurality of event detectors comprises Single-Photon Avalanche Diodes or arrays thereof.

17. The signal processing device according to claim 11, wherein said circuit is a CMOS circuit.

18. The signal processing device according to claim 11, wherein said reading circuit comprises an amplifier and a digital converter, selected from the group consisting of an Analog to Digital Converter, a Time to Digital Converter or a Time over Threshold circuit.

19. Use of the method according to claim 1 to generate a histogram of fluorescence lifetime from a biological sample.

20. Use of the device according to claim 11 to generate a histogram of fluorescence lifetime from a biological sample.

* * * * *